United States Patent
Katou

(12) United States Patent (10) Patent No.: US 8,198,751 B2
Katou (45) Date of Patent: Jun. 12, 2012

(54) SEMICONDUCTOR DEVICE AND CONTROL METHOD OF SWITCH TRANSISTOR THEREOF

(75) Inventor: Tetsuya Katou, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 276 days.

(21) Appl. No.: 12/647,683

(22) Filed: Dec. 28, 2009

(65) Prior Publication Data

US 2010/0164598 A1 Jul. 1, 2010

(30) Foreign Application Priority Data

Dec. 25, 2008 (JP) ................................. 2008-329161

(51) Int. Cl.
*H02J 1/10* (2006.01)
(52) U.S. Cl. .......................................... 307/29; 307/140
(58) Field of Classification Search .................... 307/29, 307/140

See application file for complete search history.

(56) References Cited

U.S. PATENT DOCUMENTS 7,633,314 B2 12/2009 Mair et al.
2006/0184808 A1 8/2006 Chua-Eoan et al.
2010/0097101 A1* 4/2010 Chua-Eoan et al. ............ 326/82

FOREIGN PATENT DOCUMENTS

JP 2008-532265 8/2008

* cited by examiner

*Primary Examiner* — Robert L. DeBeradinis
(74) *Attorney, Agent, or Firm* — Young & Thompson

(57) ABSTRACT

A semiconductor device of the present invention includes a plurality of switch cells having a switch transistor that controls conducting states of a global power supply line and a local power supply line according to a control signal, and a delay circuit that delays the control signal and transmits the control signal to the switch transistor connected to a subsequent stage, a chain unit that receives the control signal from outside, transmits the control signal by the delay circuit connected in series, and sequentially conducts the switch transistor, and a tree unit that is provided with the control signal via the switch cells disposed in a last stage of the chain unit, distributes the control signal to a plurality of groups by the delay circuit connected in parallel, and conducts the switch transistor in parallel by the distributed control signal.

3 Claims, 14 Drawing Sheets

US 8,198,751 B2

SEMICONDUCTOR DEVICE AND CONTROL METHOD OF SWITCH TRANSISTOR THEREOF

BACKGROUND

1. Field of the Invention

The present invention relates to a semiconductor device and a control method of a switch transistor thereof, and particularly to a semiconductor device having a switch transistor for connecting a global power supply line and a local power supply line and a control method of the switch transistor.

2. Description of Related Art

In the semiconductor device, power consumption is increasing along with higher integration. Therefore, in a semiconductor device of recent years, circuits disposed in a chip are divided into multiple areas by circuit blocks, and the semiconductor device is controlled to partly block power supply for unused blocks. One of the circuits used for such power control is a power switching circuit. A power switching circuit includes a global power supply line provided for all the circuits disposed in the chip, a local power supply line provided to the circuits disposed in a power supply controlled area, and a switch transistor for controlling the connection state. Then, the power switching circuit controls the power supply to the circuits disposed in the area where the power supply is controlled (the area hereinafter referred to as a power supply controlled area) by turning on and off the switch transistor.

If this power switching circuit is used in a semiconductor device, when the power supply is resumed to the power supply controlled area, where the power supply is blocked, the current flowing to the power supply controlled area increases, thereby reducing the voltage of the global power supply line. On the other hand, in a semiconductor device of recent years, a power supply voltage is often specified to be low in order to achieve lower power consumption. In the semiconductor device that operates on such low power supply voltage, the range of operable power supply voltage tends to be narrow. That is, in the semiconductor device that operates on such low power supply voltage, the fluctuation range of the power supply voltage with guaranteed operation is narrow. Therefore, a voltage fluctuation induced by an operation of a power switching circuit for the low power supply voltage could cause a problem of an unstable operation of the semiconductor device. Thus the technique of preventing such fluctuation of the power supply voltage by a power switching circuit is disclosed in United States Patent Publication No. 2007/0103202 and Japanese Patent Translation Publication No. 2008-532265.

FIG. 14 is a block diagram of a power switching circuit disclosed in United States Patent Publication No. 2007/0103202. As illustrated in FIG. 14, in the power switching circuit disclosed in United States Patent Publication No. 2007/0103202, combination switching circuits 505 are connected in cascade. Then, a control signal PON is input to the combination switching circuit 505 which is disposed first. The control signal PON is propagated in the cascade connected combination switching circuits 505 and returns back at the combination switch 505, which is disposed to the end. The returned control signal PON (the returned control signal hereinafter referred to as PGOOD) is propagated in the cascade connected combination switching circuits 505 again, and output as a control signal PGOOD from the first combination switching circuit 505.

Further, FIG. 15 is a circuit diagram of the combination switching circuit 505. As illustrated in FIG. 15, the combination switching circuit 505 includes inverted buffer circuits 615, 617, 620, and 622, a precharge switch 605, and a header switch 610. The combination switching circuits 505 propagate the control signal PON via the inverted buffer circuits 615 and 617. Then, the precharge switch 605 is turned on by an output from the inverted buffer circuit 615. The combination switching circuits 505 propagate the control signal PGOOD via the inverted buffer circuits 620 and 622. Then, the header switch 610 is turned on by an output from the inverted buffer circuit 620. Further, the precharge switch 605 and the header switch 610 are connected in parallel between a global power supply line VDDC and a local power supply line VDD. The size of the precharge switch 605 is smaller than the header switch 610.

United States Patent Publication No. 2007/0103202 discloses that the precharge switches 605 are conducted sequentially in response to an input of the control signal PON, and then the header switches 610 are conducted sequentially. By controlling the precharge switches 605 and the header switches 610 in this way, the current supply to the local power supply line VDD is controlled at the first stage of the current supply. Then, after all the precharge switches 605 are conducted, the header switches 610 start supplying the power. By performing such control, the maximum current value flowing from the global power supply line VDDC to the local power supply line VDD can be suppressed. Further, the voltage drop of the global power supply line VDDC can be suppressed by controlling the maximum current value.

FIG. 16 is a block diagram of a distributed current supply switching circuit disclosed in Published Japanese Translation of PCT International Publication for Patent Application, No. 2008-532265. A distributed current supply switching circuit controls the current supply state to domain circuit areas 120, 128, and 130 using multiple current supply switches 131 to 139. The conducting state of the multiple current supply switches 131 to 139 is controlled by a control circuit 110. Further, the current supply switches 131 to 139 are provided between a global supply bus GGND and a local supply bus LGND. In the distributed current supply switching circuit, if a current is supplied to the domain circuit areas 120, 128, and 130, an enable signal EN1 output from the control circuit 110 is asserted to turn on the current supply switch 131. After that, an enable signal EN2 output from the control circuit 110 is asserted to sequentially turn on the current supply switches 132 to 139. This prevents from supplying a current to the drain circuit areas 120, 128, and 130 rapidly, and also from reducing the power of the global bus (for example GPWR).

SUMMARY

However, the present inventor has found a problem that in the method disclosed in United States Patent Publication No. 2007/0103202, independently operable multiple transistors must be disposed in the combination switching circuit, thereby possibly increasing the circuit area. Further, there is a problem in the method disclosed in Japanese Patent Translation Publication No. 2008-532265 that a control method must be provided and thereby increasing the circuit area.

An exemplary aspect of an embodiment of the present invention is a semiconductor device that includes plurality of switch cells having a switch transistor that controls conducting states of a global power supply line and a local power supply line according to a control signal, where the global power supply line supplies power to a plurality of circuit areas and the local power supply line supplies power to one of the plurality of circuit areas, and a delay circuit that delays the control signal and transmits the control signal to the switch transistor connected to a subsequent stage, a chain unit that receives the control signal from outside, transmits the control signal by the delay circuit connected in series, and sequentially conducts the switch transistor, and a tree unit that is provided with the control signal via the switch cells disposed in a last stage of the chain unit, distributes the control signal to a plurality of groups by the delay circuit connected in parallel, and conducts the switch transistor in parallel by the distributed control signal.

Another exemplary aspect of an embodiment of the present invention is a semiconductor device that includes a switch cell including a switch transistor that controls conducting states of a global power supply line and a local power supply line according to a control signal, where the global power supply line supplies power to a plurality of circuit areas and the local power supply line supplies power to one of the plurality of circuit areas, and a delay circuit that delays the control signal and transmits the control signal to the switch transistor connected to a subsequent stage, a chain unit including a plurality of first switch cells including the delay circuit of the switch cell connected in series, and a tree unit that is provided with the control signal via the switch cell disposed in a last stage of the chain unit, and includes at least two of second switch cells including the delay circuit of the switch cell connected in parallel to each other.

Another exemplary aspect of an embodiment of the present invention is a method of controlling a switch transistor in a semiconductor device, the semiconductor device including a plurality of switch transistors that control conducting states of a global power supply line and a local power supply line according to a control signal, where the global power supply line supplies power to a plurality of circuit areas and the local power supply line supplies power to one of the plurality of circuit areas, and the method includes propagating the control signal in series in a first period and sequentially conducting the switch transistor, where the first period starts in response to an assert of the control signal, and branching the control signal propagated in the first period in a second period following the first period and propagating the control signal in parallel and conducting the plurality of switch transistors in parallel by the control signal that is propagated in parallel.

In the semiconductor device and the control method of the switch transistor according to the present invention, at first the multiple switch transistors are conducted in series sequentially in response to an input of the control signal. After that, multiple switch transistors are conducted in parallel. That is, in the semiconductor device and the control method of the switch transistors according to the present invention, multiple switch cells having one switch transistor can be controlled in phases. The semiconductor device and the control method of the switch transistors according present invention suppresses a fluctuation of the power supply voltage caused by the power supply to the area in which the power supply is controlled, by controlling the conducting order of the switch cells and the number of the conducting switch cells in phases.

The semiconductor device and a control method of a switch transistor according to the present invention enable to prevent from increasing the circuit size while suppressing the power supply voltage.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
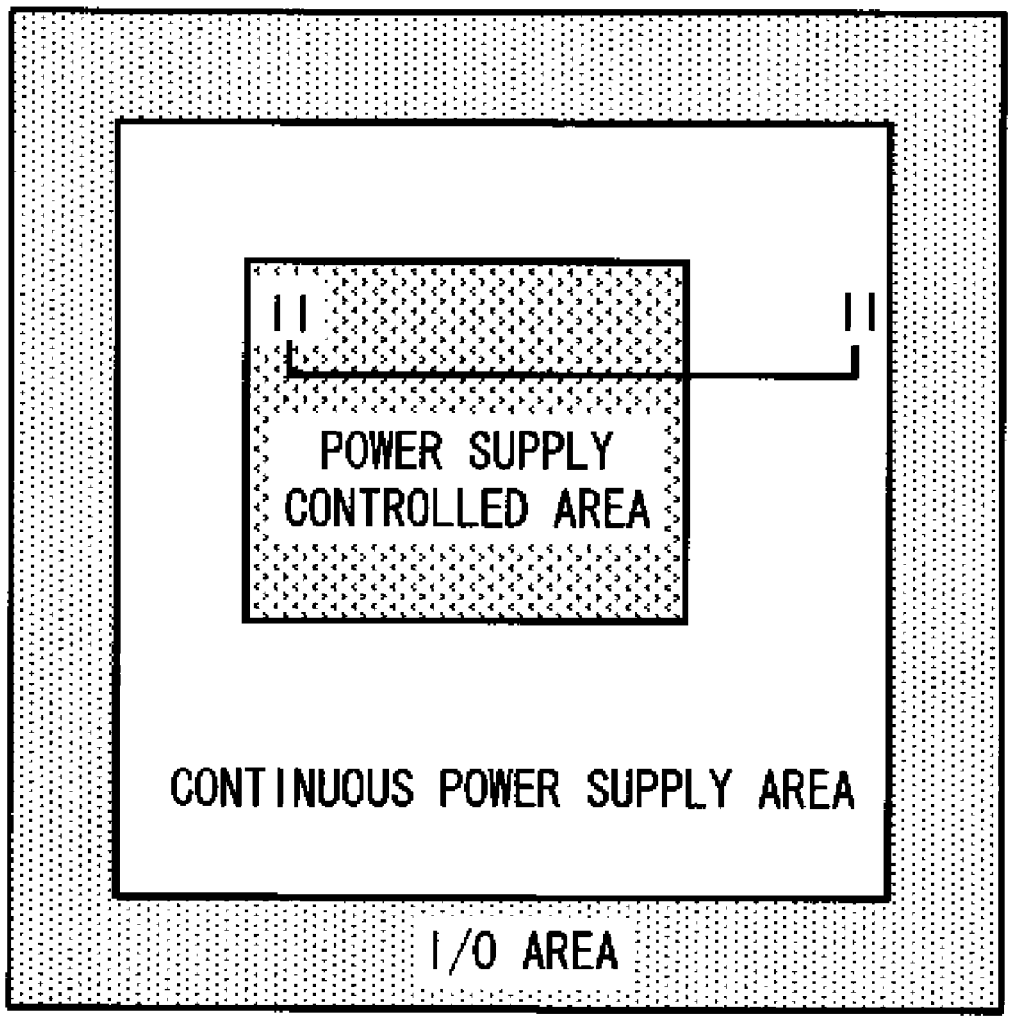
FIG. 1 is a schematic diagram illustrating a flat surface layout of a semiconductor device according to a first exemplary embodiment.

Hereinafter, an exemplary embodiment of the present invention is described with reference to the drawings. A pattern diagram of the semiconductor device according to this exemplary embodiment is illustrated in FIG. 1. As illustrated in FIG. 1, the semiconductor device of this exemplary embodiment includes an I/O area, a first area (for example, a power supply controlled area), and a second area (for example, a continuous power supply area).

An external interface circuit in the semiconductor device is disposed in the I/O area. The external interface circuit includes an input/output circuit and a pad, for example. A functional circuit that realizes various functions mounted to the semiconductor device is disposed in both of the power supply controlled area and the continuous power supply area. In this exemplary embodiment, the functional circuit is composed of cells that realize minimum functions of circuits (the cells hereinafter referred to as standard cells).

Further, the power supply controlled area includes a switching circuit (hereinafter referred to as a switch cell). Power is supplied to the standard cell disposed in the power supply controlled area via the switch cell. That is, the power is supplied to the standard cell disposed in the power supply controlled area if the switch cell is in an ON state to make the standard cell operable. If the switch cell is in an OFF state, the power supply is blocked and the standard cell enters to a stopped state.

On the other hand, the power is supplied externally to the standard cell disposed in the continuous power supply area without intervening the switch cell. That is, the power is always supplied to the standard cell disposed in the continuous power supply area in the period while the power is externally supplied to the semiconductor device.

Figure 2:
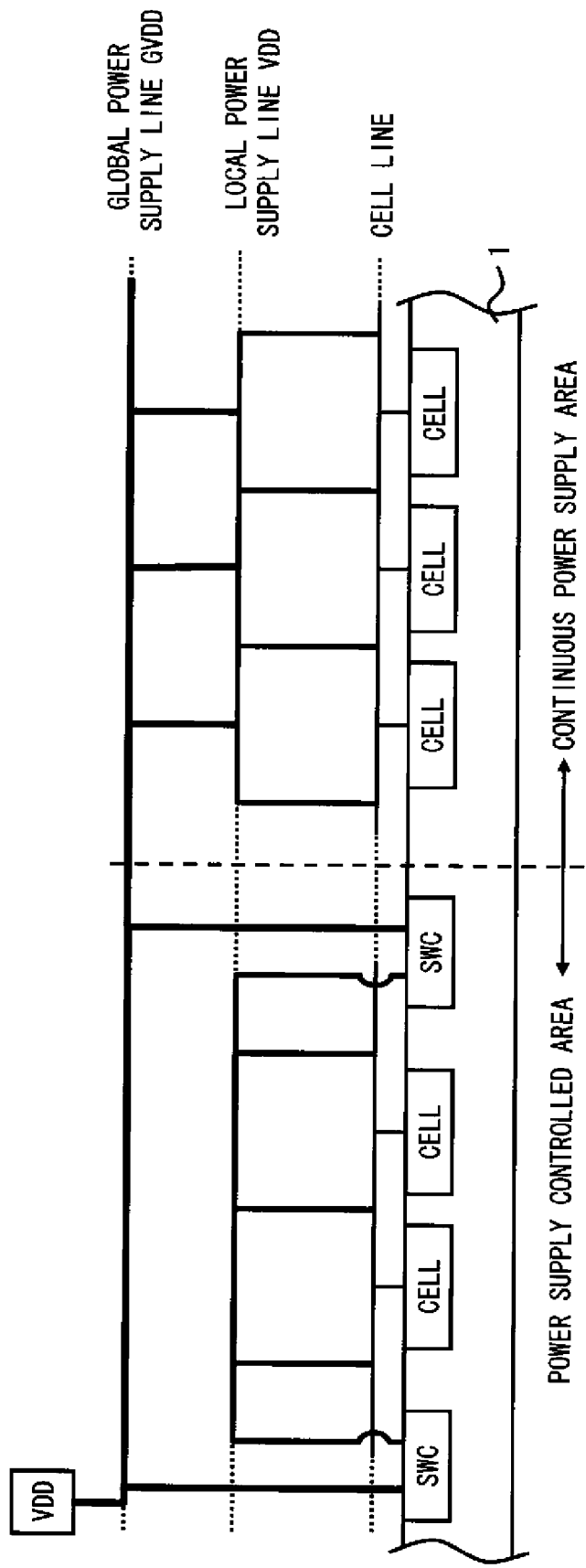
FIG. 2 is a schematic diagram illustrating a wire layout of the semiconductor device according to the first exemplary embodiment.

FIG. 2 is a pattern diagram of the cross-sectional diagram of the semiconductor device along the line II-II of FIG. 1. As illustrated in FIG. 2, a semiconductor device includes a semiconductor substrate 1 and multiple wiring layers provided to an upper layer of the semiconductor substrate 1. In the example illustrated in FIG. 2, there are three wiring layers, however in the present invention, the number of wiring layers can be specified as appropriate.

In the area corresponding to the continuous power supply area in the semiconductor substrate 1, a transistor (which is simply referred to as a cell in FIG. 2) that composes the standard cell provided in the semiconductor device is formed. A standard cell and a switch cell SWC are formed to the area corresponding to the power supply controlled area.

Further, in the example illustrated in FIG. 2, the global power supply line GVDD is provided to the top layer of the wiring layers. The global power supply line GVDD supplies power to the circuit which is formed in the circuit formed area (the area including the power supply controlled area and the continuous power supply area) of the semiconductor device. The global power supply line GVDD is formed across the entire circuit formed area. The global power supply line GVDD is connected to the power supply pad provided in the I/O area, and supplied with external power.

In the example illustrated in FIG. 2, the local power supply line LVDD is provided to the lower layer of the global power supply line GVDD. The local power supply line LVDD is formed separately in the power supply controlled area and the continuous power supply area. Among the local power supply lines LVDD, the local power supply line LVDD provided to correspond to the power supply controlled area is connected to the global power supply line GVDD via the switch cell SWC. Further, among the local power supply lines LVDD, the local power supply line LVDD provided to correspond to the power supply controlled area supplies power to the circuits provided in the power supply controlled area. Among the local power supply lines LVDD, the local power supply line LVDD provided to correspond to the continuous power supply area is directly connected to the global power supply line GVDD. Moreover, among the local power supply lines LVDD, the local power supply line LVDD provided to correspond to the continuous power supply area supplies power to the circuits provided in the continuous power supply area.

In the example illustrated in FIG. 2, cell lines are provided in the lower layer of the local power supply line LVDD. The cell lines connect between the standard cells formed over the semiconductor substrate 1 or connect between devices that compose a circuit. Moreover, a part of the cell lines can be used as the local power supply line LVDD. In that case, the cell lines used as the local power supply line LVDD are directly connected to the switch cells SWC.

Note that in the semiconductor device of this exemplary embodiment, the global power supply line GVDD and the local power supply line LVDD in the continuous power supply area are connected by a via line. Further, the local power supply line LVDD and the cell lines are connected by a via line. The cell line and the standard cell are connected by a contact line.

Figure 3:
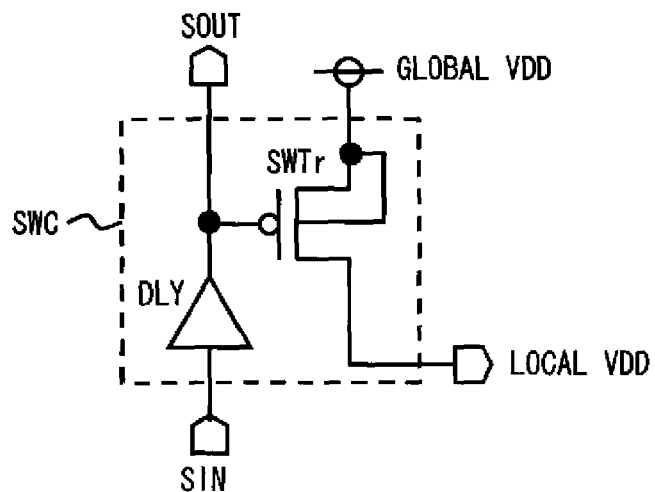
FIG. 3 is a circuit diagram of a switch cell according to the first exemplary embodiment.

The detail of the switch cell SWC of this exemplary embodiment is explained hereinafter. FIG. 3 is a circuit diagram of the switch cell. As illustrated in FIG. 3, the switch cell SWC includes a delay device (delay circuit DLY), a control signal input terminal SIN, a control signal output terminal SOUT, and a switch transistor SWTr. The delay circuit DLY delays a control signal input from the control signal input terminal SIN and outputs it to the control signal output terminal SOUT. The delay circuit DLY is connected between the global power supply line GVDD and a ground line, and operates without depending on the power supplied to the power supply controlled area. In this exemplary embodiment, the delay circuit DLY shall drive the switch transistor SWTr in the same cell. That is, the delay circuit DLY has a function as a delay circuit of a control signal, and a function as a driving buffer provided to the switch transistor SWTr. Note that the delay circuit DLY may drive the switch transistor SWTr in the switch cell disposed in the next stage. The switch transistor SWTr is composed of a PMOS transistor, for example. A source of the switch transistor SWTr is connected to the global power supply line GVDD, and a drain is connected to the local power supply line LVDD. The control signal input from the control signal input terminal SIN is provided to a gate of the switch transistor SWTr. Then, the switch transistor SWTr controls the conducting states of the global power supply line GVDD and the local power supply line LVDD according to the logic level of the control signal.

Note that the switch transistor SWTr can also be composed of an NMOS transistor. In that case, the switch transistor SWTr is provided to the ground side of the standard cell. More specifically, the switch transistor SWTr is provided between the local ground line for supplying a ground potential to the power supply controlled area and the global ground line for supplying a ground potential to the entire chip. A drain of the NMOS transistor is connected to the local ground line, and a source is connected to the global ground line. Further, the switch transistor SWTr is conducted (becomes ON state) by a control signal having an inverted logic to the case in which the switch transistor SWTr is composed of a PMOS transistor.

Figure 4:
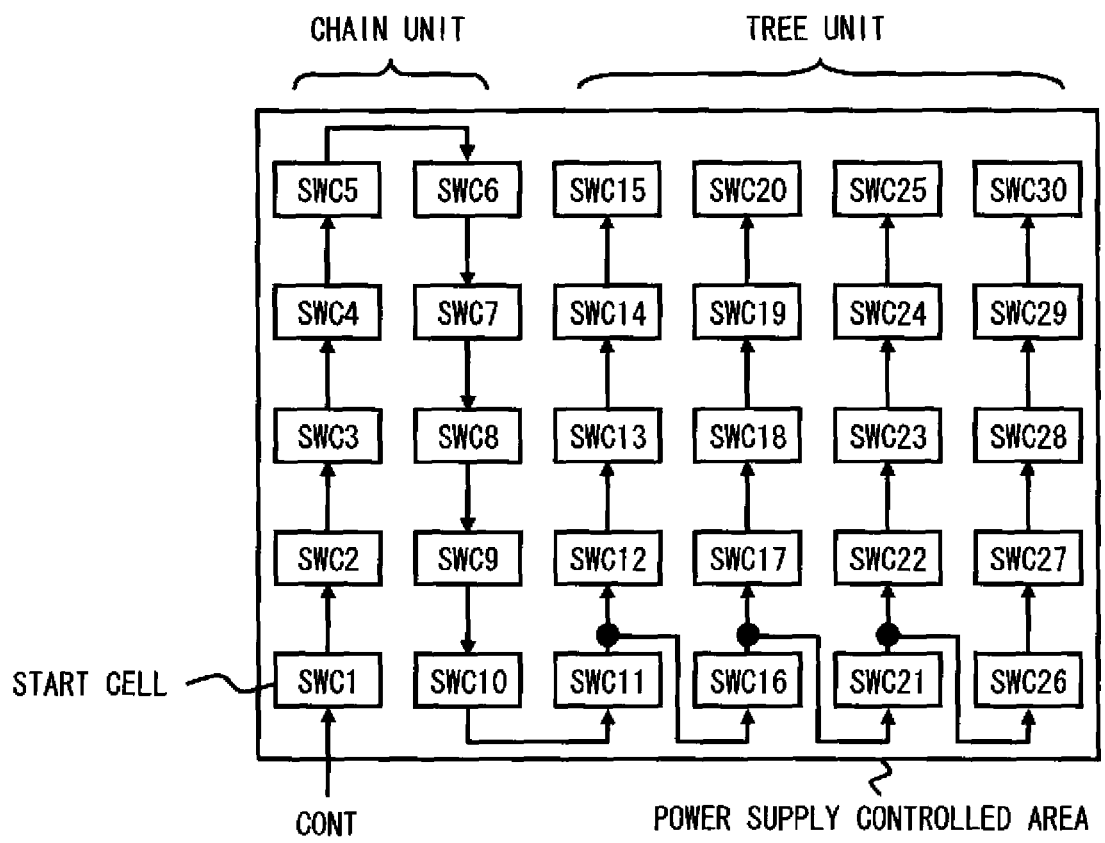
FIG. 4 is a schematic diagram illustrating a layout of switch transistors disposed in a power supply controlled area and a propagation order of a control signal propagated in the switch transistors according to the first exemplary embodiment.

The semiconductor device of this exemplary embodiment includes multiple switch cells SWC, that are illustrated in FIG. 3, in the power supply controlled area. Then, the connection of the delay circuits DLY of the switch cells SWC is changed depending on the order of the switch cells to turn on. FIG. 4 is a schematic diagram of the switch cell SWC disposed in the power supply controlled area. As illustrated in FIG. 4, in this exemplary embodiment, the switch cells SWC are disposed in matrix in the power supply controlled area. Then, the switch cells SWC are categorized into a chain unit and a tree unit according to the order in which the switch cells SWC turn on. The tree unit in this exemplary embodiment is disposed in the subsequent stage of the chain unit. Note that the arrows illustrated in FIG. 4 indicate the propagation direction of the control signal CONT. In FIG. 4, the numerals following the code indicating the switch cells SWC specify individual switch cells SWC.

As illustrated in FIG. 4, the chain unit includes multiple first switch cells (for example, switch cells SWC1 to SWC10). The delay circuits DLY in the switch cells SWC1 to SWC10 are connected in series. Therefore, a control signal CONT input externally according to the path connected to the delay circuits DLY sequentially propagates in the switch cells included in the chain unit. Then, the switch transistors SWTr included in the switch cell SWC are turned on in the order that the control signal CONT is propagated. Note that the switch cell SWC1 disposed in the first stage among the switch cells included in the chain unit is referred to as a start cell.

Further, the control signal CONT is provided to the tree unit via the switch cell SWC10 that is disposed in the last stage of the chain unit. Then, among the switch cells of the chain unit, the switch cell SWC11 distributes the control signal CONT to multiple switch cells (for example switch cells SWC12 and SWC16). In this exemplary embodiment, the delay circuits DLY of the switch cells SWC12 and SWC16 are connected in parallel. Then, in the tree unit, the delay circuits connected in parallel distribute the control signal CONT. The distributed control signal CONT turns on the switch transistors in parallel.

In the example illustrated in FIG. 4, the delay circuits DLY of the switch cells SWC12 and SWC16 are connected in parallel. The delay circuits DLY of the switch cells SWC17 and SWC21 are connected in parallel. The switch cells SWC22 and SWC26 are connected in parallel. The switch cells SWC12 and SWC16 receive the control signal CONT, which is output from the switch cell SWC11. The switch cells SWC17 and SWC21 receive the control signal CONT, which is output from the switch cell SWC16. The switch cells SWC22 and SWC26 receive the control signal CONT, which is output from the switch cell SWC21. That is, in this exemplary embodiment, by connecting the switch cells connected in parallel, a control signal is distributed to multiple groups. In the example illustrated in FIG. 4, the control signal CONT is distributed to the group including the switch cells SWC11 to SWC15, the group including the switch cells SWC16 to SWC20, the group including the switch cells SWC21 to SWC25, and the group including the switch cells SWC25 to SWC30.

Further, the switch cells SWC13 to SWC15 are connected to the subsequent stage of the switch cell SWC12, and the delay circuits DLY of the switch cells SWC12 to SWC15 are connected in series. The switch cells SWC18 to SWC20 are connected to the subsequent stage of the switch cell SWC17, and the delay circuits DLY of the switch cells SWC17 to SWC20 are connected in series. The switch cell SWC23 to SWC25 are connected to the subsequent stage of the switch cell SWC22, and the delay circuits DLY of the switch cells SWC22 to SWC25 are connected in series. The switch cells SWC27 to SWC30 are connected to the subsequent stage of the switch cell SWC26, and the delay circuits DLY of the switch cells SWC26 to SWC30 are connected in series.

Figure 5:
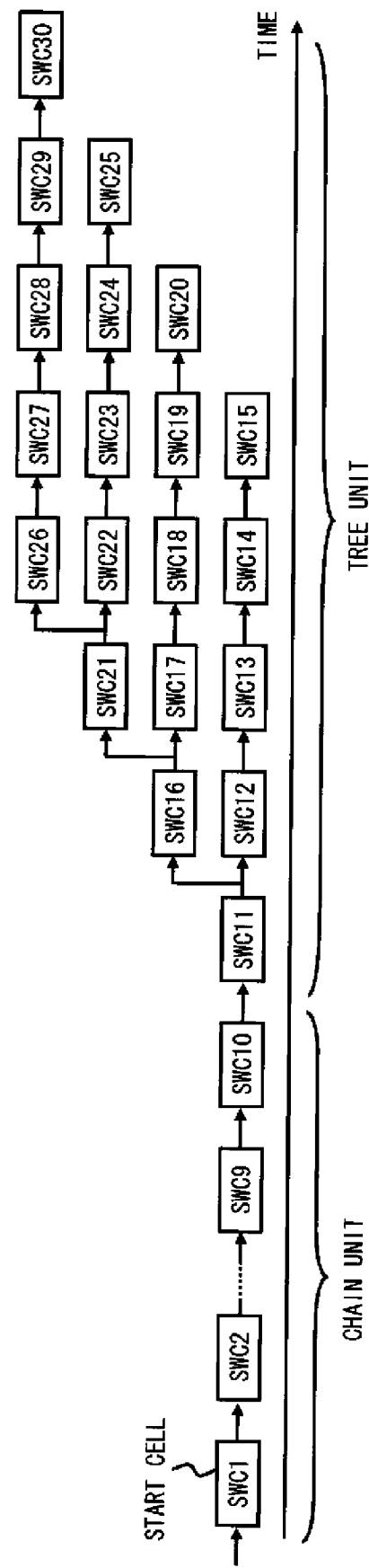
FIG. 5 is a schematic diagram illustrating a propagation order of the control signal propagated in the switch transistors disposed in the power supply controlled area according to the first exemplary embodiment.

FIG. 5 illustrates the propagation order of the control signal CONT when the delay circuits DLY are connected in the manner illustrated in FIG. 4. As illustrated in FIG. 5, in the chain unit, the control signal CONT is propagated in order from the switch cells SWC1 to SWC10. On the other hand, in the tree unit, the control signal CONT is propagated in parallel to the multiple switch cells. Moreover, as for the part in which the delay circuits DLY are connected in series in the tree unit, the control signal CONT is propagated in order according to the connection of the delay circuits DLY.

Figure 6:
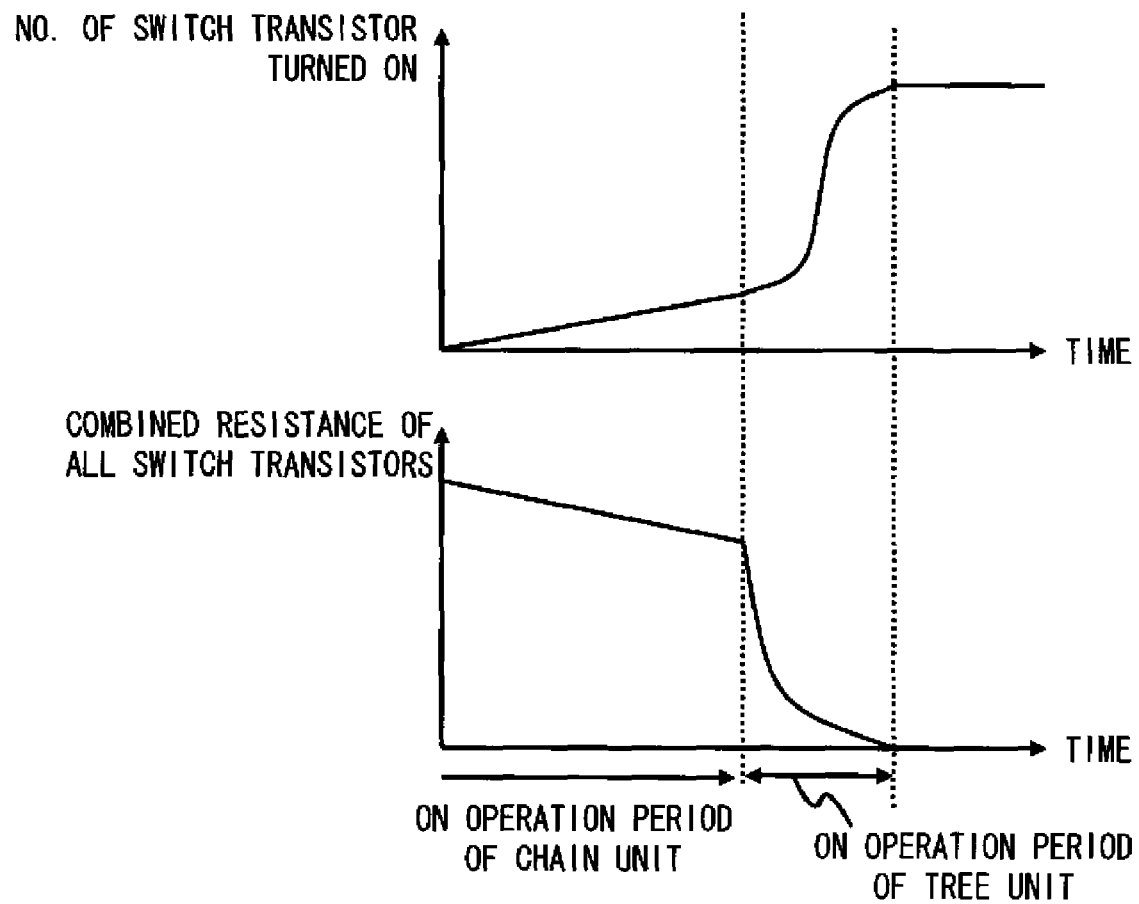
FIG. 6 is a graph depicting a time change of the number of the switch transistors that turn on and a time change of a combined resistance of all the switch transistors according to the first exemplary embodiment.

FIG. 6 is a graph depicting the time change of the number of switch transistors SWTr that turned on when turning on the switch transistors, and the time change of a combined resistance of all the switch transistors in the semiconductor device of this exemplary embodiment. The upper graph of FIG. 6 depicts the time change of the number of the switch transistors SWTr that turned on. As illustrated in the upper graph of FIG. 6, in the semiconductor device of this exemplary embodiment, a first period (for example, an ON operation period of the chain unit) starts in response to an input of the control signal CONT. Then, in the ON operation period of the chain unit, the number of the switch transistors SWTr that turned on increases with time. Therefore, the increasing function of the number of the switch transistors SWTr that turned on in the ON operation period of the chain unit is a linear function. On the other hand, the second period (for example, the ON operation period of the tree unit) starts after completing the ON operation period of the chain unit. In the ON operation period of the tree unit, the number of the switch transistors SWTr that turned on at the same time changes with time (that is, the number of the switch transistors SWTr that turn on in parallel changes). Therefore, the increasing function of the number of the switch transistors that turned on in the ON operation period of the tree unit is a multidimensional function.

The lower graph of FIG. 6 indicates the time change of the combined resistance of all the switch transistors SWTr. As illustrated in the lower graph of FIG. 6, in the ON operation period of the chain unit, the combined resistance of all of the switch transistors SWTr is reduced according to the number of the switch transistors SWTr that turned on. At this time, the decreasing function of the combined resistance in the ON operation period of the chain unit is a linear function. On the other hand, as the switch transistors SWTr turn on in parallel in the ON operation period of the tree unit, the combined resistance is reduced more rapidly than in the ON operation period of the chain unit. At this time, the switch transistors SWTr turn on in parallel in the ON operation period of the tree unit, thus the decreasing function of the combined resistance is a multidimensional function. Then, when all the switch transistors SWTr turn on, the combined resistance will become zero substantially.

Figure 7:
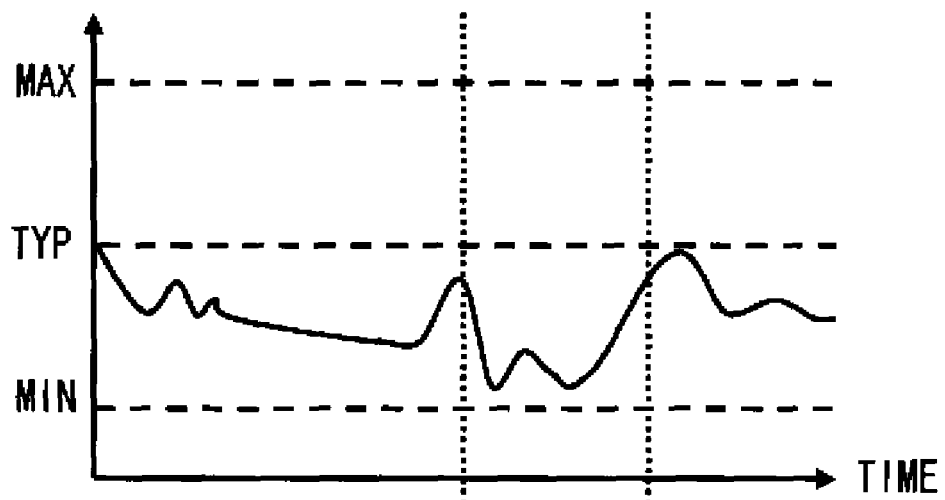
FIG. 7 is a graph depicting a potential change of a global power supply line and a potential change of a local power supply line according to the first exemplary embodiment.
Figure 7:
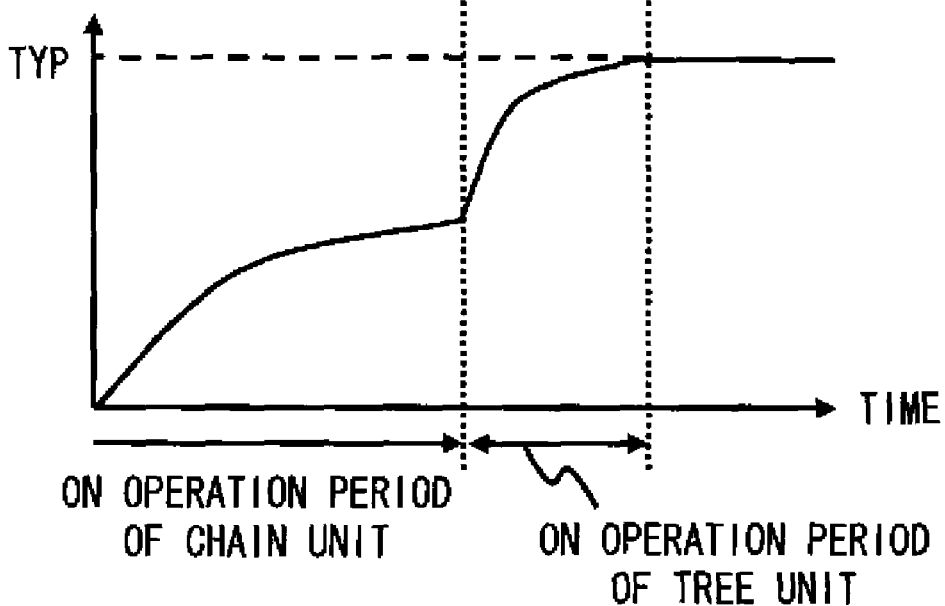

FIG. 7 is a graph illustrating a potential change of the global power supply line GVDD and the local power supply line LVDD when the switch transistors SWTr supply power to the power supply controlled area. As illustrated in FIG. 7, when the ON operation period of the chain unit starts, the potential of the local power supply line increases gradually. At this time, the current flows from the global power supply line to the local power supply line, thus the potential of the global power supply line GVDD becomes unstable. However, the switch transistors SWTr sequentially turn on one by one in the ON operation period of the chain unit. This enables to prevent the current from rapidly flowing from the global power supply line GVDD to the local power supply line LVDD, and also to minimize the potential change of the global power supply line GVDD. That is, in the example illustrated in FIG. 7, the potential of the global power supply line GVDD will not become lower than a minimum value of the power supply voltage.

Further, as the multiple switch transistors SWTr turn on in parallel in the ON operation period of the tree unit, the potential of the local power supply line LVDD increases more rapidly than in the ON operation period of the chain unit. Then, the potential of the local power supply line LVDD reaches a reference voltage TYP at the timing when the ON operation period of the tree unit is completed. Moreover, the switch transistors SWTr turn on in parallel in the ON operation period of the tree unit, thus the current amount flowing from the global power supply line GVDD to the local power supply line LVDD increases more than in the ON operation period of the chain unit. However, as the capacitance parasitic to the circuit connected to the local power supply line LVDD is charged in the ON operation period of the chain unit, the current will not rapidly flow into the local power supply line LVDD. Therefore, the semiconductor device of this exemplary embodiment prevents the potential of the global power supply line GVDD from being rapidly reduced even in the ON operation period of the tree unit. In the example illustrated in FIG. 7, the potential of the global power supply line GVDD is not reduced lower than the minimum value MIN of the power supply voltage even in the ON operation period of the tree unit.

From the above explanation, in the semiconductor device of this exemplary embodiment, the switch transistors SWTr are turned on when the power supply to the power supply controlled area is started. At this time, in the semiconductor device of this exemplary embodiment, the propagation order of the control signal CONT is changed by changing the connection method of the delay circuit DLY of the switch cell SWC by the chain and the tree units. Accordingly, in the semiconductor device of this exemplary embodiment, the switch transistors SWTr sequentially turn on one by one in the ON operation period of the chain unit. Then, the ON operation period of the tree unit is started at the point when all of the switch transistors SWTr of the chain unit turn on, and multiple switch transistors SWTr turn on in parallel in the ON operation period of the tree unit. That is, in the semiconductor device of this exemplary embodiment, the reduction of the combined resistance of all the switch transistors SWTr is accelerated in the ON operation period of the tree unit while the combined resistance of the switch transistors SWTr is gradually reduced in the ON operation period of the chain unit.

Then the semiconductor device of this exemplary embodiment specifies a limit to the current amount flowing from the global power supply line GVDD to the local power supply line LVDD in the ON operation period of the chain unit so as to suppress the potential fluctuation of the global power supply line GVDD. Further, the time period when all the switch transistors SWTr turn on is reduced by turning on multiple switch transistors SWTr in parallel in the ON operation period of the tree unit. At this time, by providing the ON operation period of the chain unit before the ON operation period of the tree unit, the parasitic capacitance connected to the local power supply line LVDD can be charged before the ON operation period of the tree unit is started. Therefore, the semiconductor device of this exemplary embodiment can suppress the potential fluctuation of the global power supply line GVDD even in the ON operation period of the tree unit.

Moreover, the semiconductor device of this exemplary embodiment can avoid a startup failure of the circuits disposed in the power supply controlled area by providing the tree unit in the subsequent stage of the chain unit. By turning on all the switch transistors SWTr in series that supply power to the power supply controlled area, the current amount flowing into the local power supply line LVDD can be limited, thereby enabling to suppress the potential fluctuation of the global power supply line GVDD. However, if all the switch transistors SWTr are sequentially turned on (such control method of the switch transistors hereinafter referred to as a slow start control), the period until all the switch transistors SWTr turn on is extended and the increase of the potential of the local power supply line LVDD slows down.

Generally in a transistor, from when the power supply is started until the switching operation of ON/OFF is properly performed, there is a status in which the leak current increases temporarily. Therefore, if all the switch transistors are controlled to be slow start, when the potential of the local power supply line LVDD reaches the potential in which a leak current of the transistor increases, the potential will not increase further. This is because that if the leak current increases and the sum of the leak current becomes too large, all the currents supplied via the switch transistors are consumed as leak currents.

However, in the semiconductor device of this exemplary embodiment, the switch transistors SWTr are controlled to be slow start in the ON operation period of the chain unit. After that, in the ON operation of the tree unit, the potential of the local power supply line LVDD is rapidly increased. Therefore, in the semiconductor device of this exemplary embodiment, the potential of the local power supply line LVDD can be increased to the potential in which the transistor operates correctly. Accordingly, the semiconductor device of this exemplary embodiment can prevent startup failures in the circuits disposed in the power supply controlled area.

Figure 8:
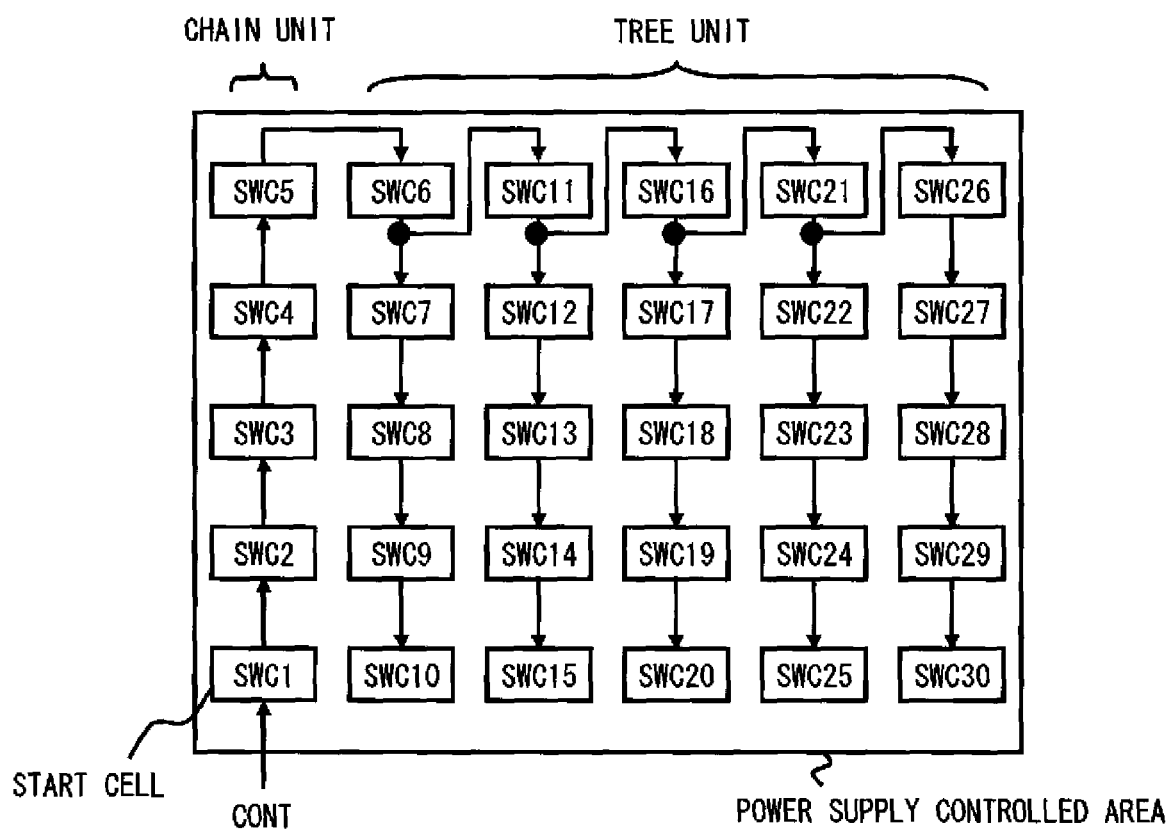
FIG. 8 is a schematic diagram of a modification example of the switch transistors disposed in the power supply controlled area according to the first exemplary embodiment.

Note that the connection method of the delay circuit DLY of the switch cells SWC is not limited only to the mode explained above. FIG. 8 illustrates a connection example with reduced number of switch cells disposed in the chain unit. In the example illustrated in FIG. 8, the number of the switch cells SWC disposed in the chain unit is reduced from 10 to 5. Thus, by changing the number of the switch cells disposed in the chain unit, it is possible to control the potential fluctuation of the global power supply line GVDD and the local power supply line LVDD and also the time period until all the switch cells are turned on.

Second Exemplary Embodiment

The second exemplary embodiment explains a modification example of the connection method of the switch cells disposed in the tree unit. In the semiconductor device of the first exemplary embodiment, the number of the switch transistors disposed in the tree unit to start the ON operation increases or decreases with time. On the other hand, in the semiconductor device of the second exemplary embodiment, the number of the switch transistors in the tree unit that starts the ON operation during the ON operation period is kept constant. Note that also in the semiconductor device of the second exemplary embodiment, the switch transistors in the chain unit turn on one by one, but in the tree unit, multiple switch transistors turn on in parallel.

Figure 9:
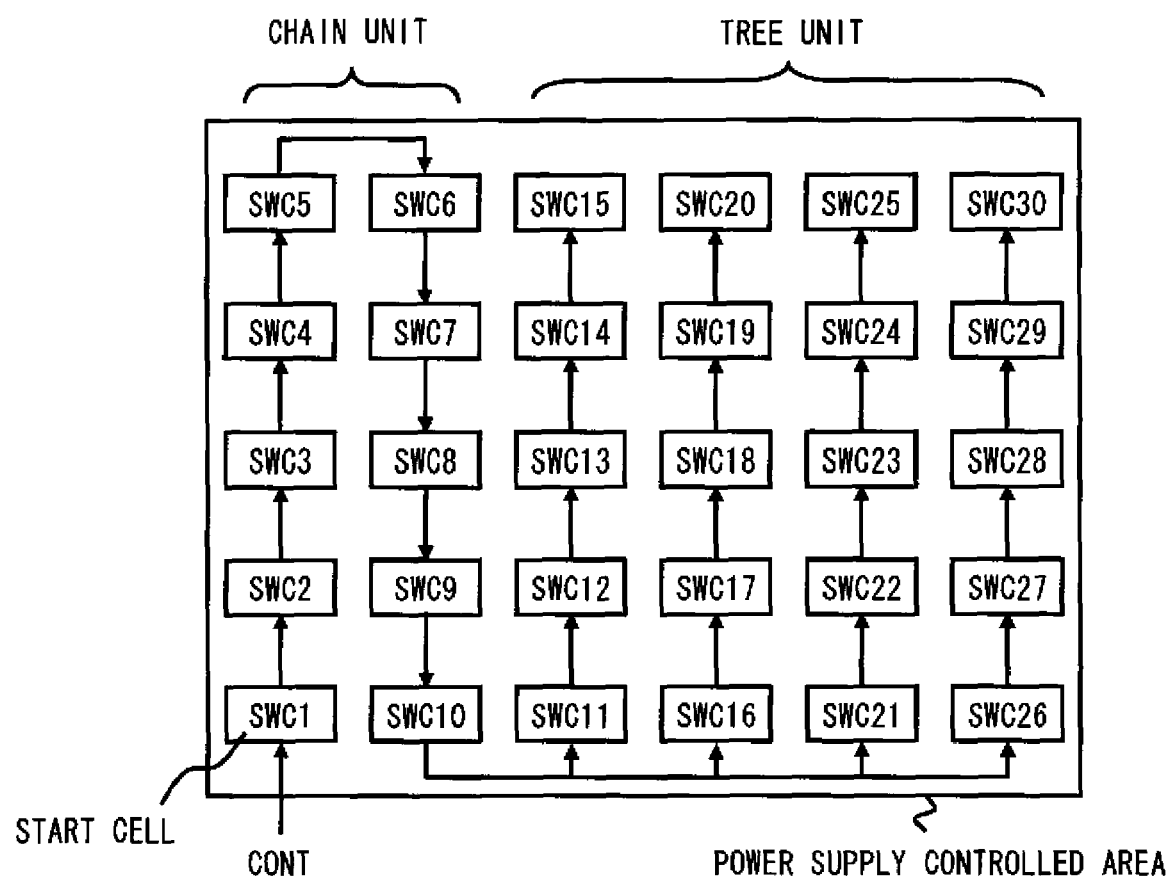
FIG. 9 is a schematic diagram illustrating a layout of switch transistors disposed in a power supply controlled area and a propagation order of a control signal propagated in the switch transistors according to a second exemplary embodiment.

FIG. 9 is a schematic diagram of the switch cell SWC disposed in the power supply controlled area of the semiconductor device according to the second exemplary embodiment. As illustrated in FIG. 9, also in the second exemplary embodiment, the chain unit includes multiple first switch cells (for example switch cells SWC1 to SWC10). The delay circuits DLY in the switch cells SWC1 to SWC10 are connected in series. Therefore, a control signal CONT input externally according to the path connected to the delay circuits DLY sequentially propagates to the switch cells included in the chain unit. Then, the switch transistors SWTr included in the switch cell SWC are turned on in the order that the control signal CONT is propagated. Note that the switch cell SWC1 which is disposed in the first stage among the switch cells included in the chain unit is referred to as a start cell.

Further, in the semiconductor device according to the second exemplary embodiment, the control signal CONT is provided to the tree unit via the switch cell SWC10 that is disposed in the last stage of the chain unit. Then, this control signal CONT is provided to the switch cells SWC11, SWC16, SWC21, and SWC26. That is, in the second exemplary embodiment, the delay circuits DLY of the switch cells SWC11, SWC16, SWC21, and SWC26 are connected in parallel. Then, in the tree unit, the parallel connected delay circuits DLY distribute the control signal CONT. The distributed control signal CONT turns on the switch transistors in parallel.

Further, the switch cells SWC12 to SWC15 are connected to the subsequent stage of the switch cell SWC11, and the delay circuits DLY of the switch cells SWC11 to SWC15 are connected in series. The switch cells SWC17 to SWC20 are connected to the subsequent stage of the switch cell SWC16, and the delay circuits DLY of the switch cells SWC16 to SWC20 are connected in series. The switch cells SWC22 to SWC25 are connected to the subsequent stage of the switch cell SWC21, and the delay circuits DLY of the switch cells SWC21 to SWC24 are connected in series. The switch cells SWC27 to SWC30 are connected to the subsequent stage of the switch cell SWC26, and the delay circuits DLY of the switch cells SWC26 to SWC30 are connected in series.

Figure 10:
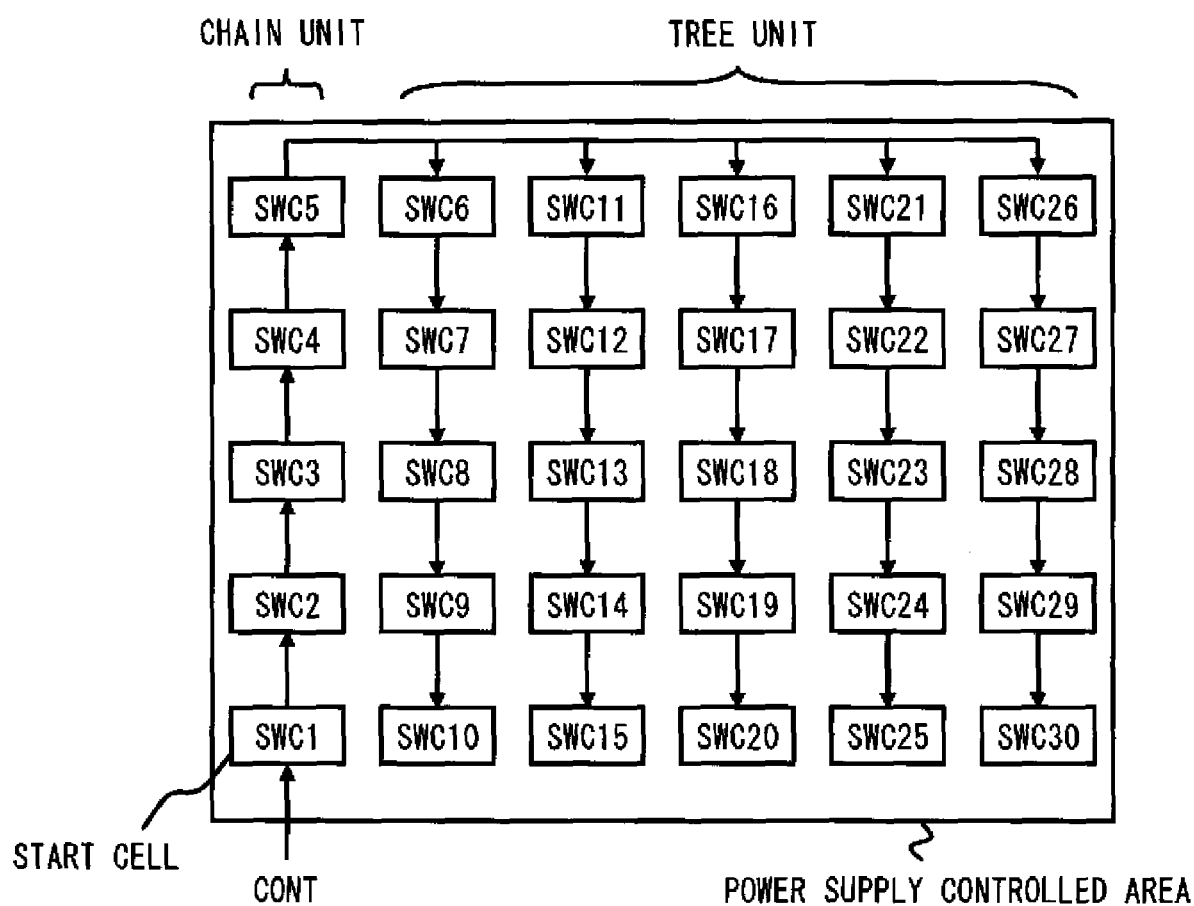
FIG. 10 is a schematic diagram of a modification example of the switch transistors disposed in the power supply controlled area according to the second exemplary embodiment.

Note that also in the semiconductor device according to the second exemplary embodiment, the number of the switch cells disposed in the chain unit can be changed. FIG. 10 is a layout example of reduced number of switch cells disposed in the chain unit.

Figure 11:
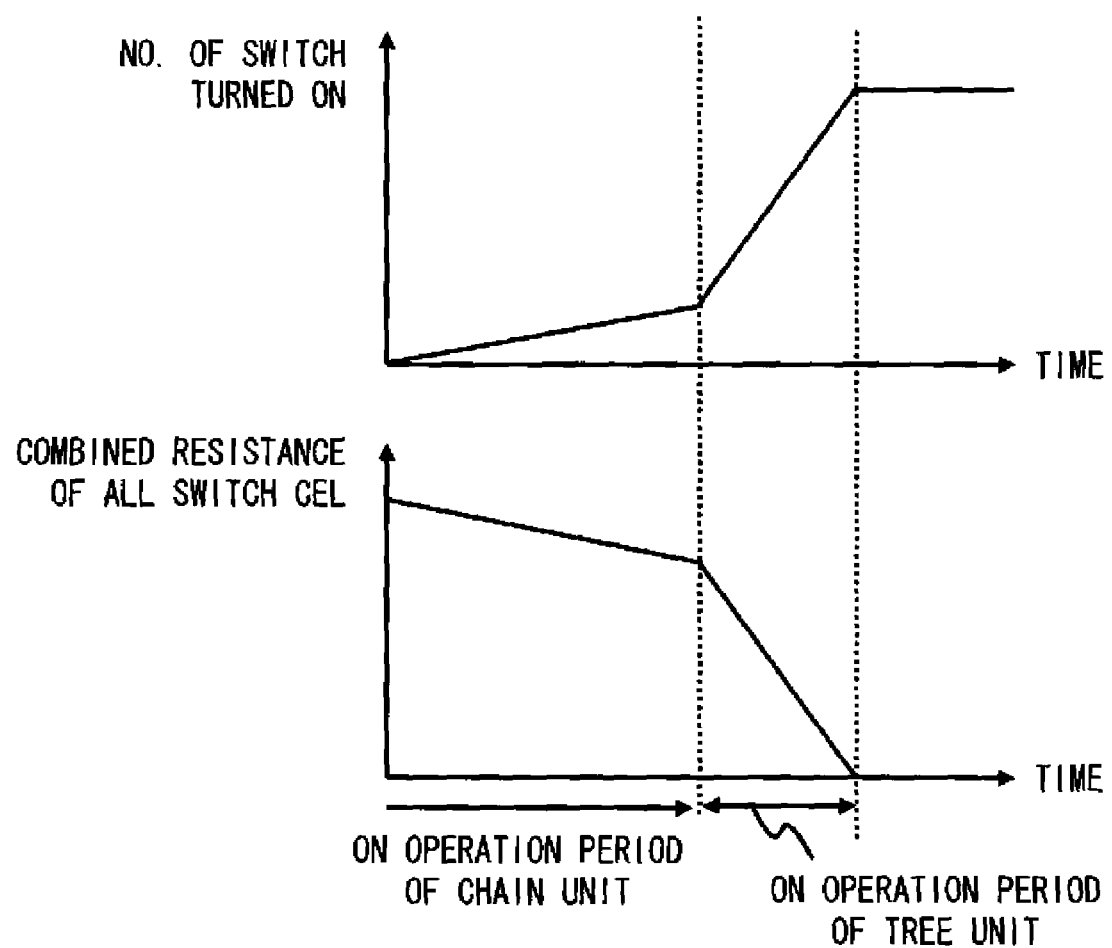
FIG. 11 is a graph depicting a time change of the number of the switch transistors that turn on and a time change of a combined resistance of all the switch transistors according to the second exemplary embodiment.

FIG. 11 is a graph depicting the time change of the number of the switch transistors SWTr that turned on when turning on the switch transistors in the semiconductor device of the second exemplary embodiment, and the time change of a combined resistance of all the switch transistors. The upper graph of FIG. 11 depicts the time change of the number of the switch transistors SWTr that turned on. As illustrated in the upper graph of FIG. 11, in the semiconductor device of the second exemplary embodiment, a first period (for example, the ON operation period of the chain unit) starts in response to an input of the control signal CONT. Then, in the ON operation period of the chain unit, the number of the switch transistors SWTr that turned on increases with time. Therefore, the increasing function of the number of the switch transistors SWTr that turned on in the ON operation period of the chain unit is a linear function. On the other hand, the second period (for example, the ON operation period of the tree unit) starts after completing the ON operation period of the chain unit. In the ON operation period of the tree unit, the number of the switch transistors turned on at the same time is 4. Therefore, the increasing function of the number of the switch transistors SWTr that turned on in the ON operation period of the tree unit is a linear function. That is, in the second exemplary embodiment, the number of the switch transistors that turned on in both of the ON operation periods of the chain and the tree units increases by a linear function. However the gradient of the ON operation period of the tree unit is steeper than that of the ON operation period of the chain unit.

The lower graph of FIG. 11 indicates the time change of the combined resistance of all the switch transistors SWTr. As illustrated in the lower graph of FIG. 11, in the ON operation period of the chain unit, the combined resistance of all of the switch transistors SWTr is reduced according to the number of the switch transistors SWTr that turned on. At this time, the decreasing function of the combined resistance in the ON operation period of the chain unit is a linear function. On the other hand, as four switch transistors turn on in parallel in the ON operation period of the tree unit, the combined resistance is reduced more rapidly than in the ON operation period of the chain unit. Since the number of switch transistor SWTr arranged in parallel and turned on in the ON action period of a tree unit is constant at this time, the decreasing function of combined resistance is a linear function. That is, in the second exemplary embodiment, the combined resistance of the switch transistors is reduced by a linear function in both of the ON operation periods of the chain and the tree units. However the gradient of the ON operation period of the tree unit is steeper than that of the ON operation period of the chain unit.

From the above explanation, also in the second exemplary embodiment, by providing the chain and the tree units, the decrease in the combined resistance of all the switch transistors can be changed. Accordingly, the second exemplary embodiment also enables to stabilize the potential of the global power supply line GVDD, reduce the time period until all switch transistors turn on, and avoid a startup failure of the circuits disposed in the power supply controlled area.

Third Exemplary Embodiment

The third exemplary embodiment explains a modification example of the connection method of the switch cells disposed in the tree unit. There is one tree unit in the semiconductor device according to the first exemplary embodiment, however there are two tree units in the third exemplary embodiment. The number of the switch transistor that turn on in parallel is different in the two tree units.

Figure 12:
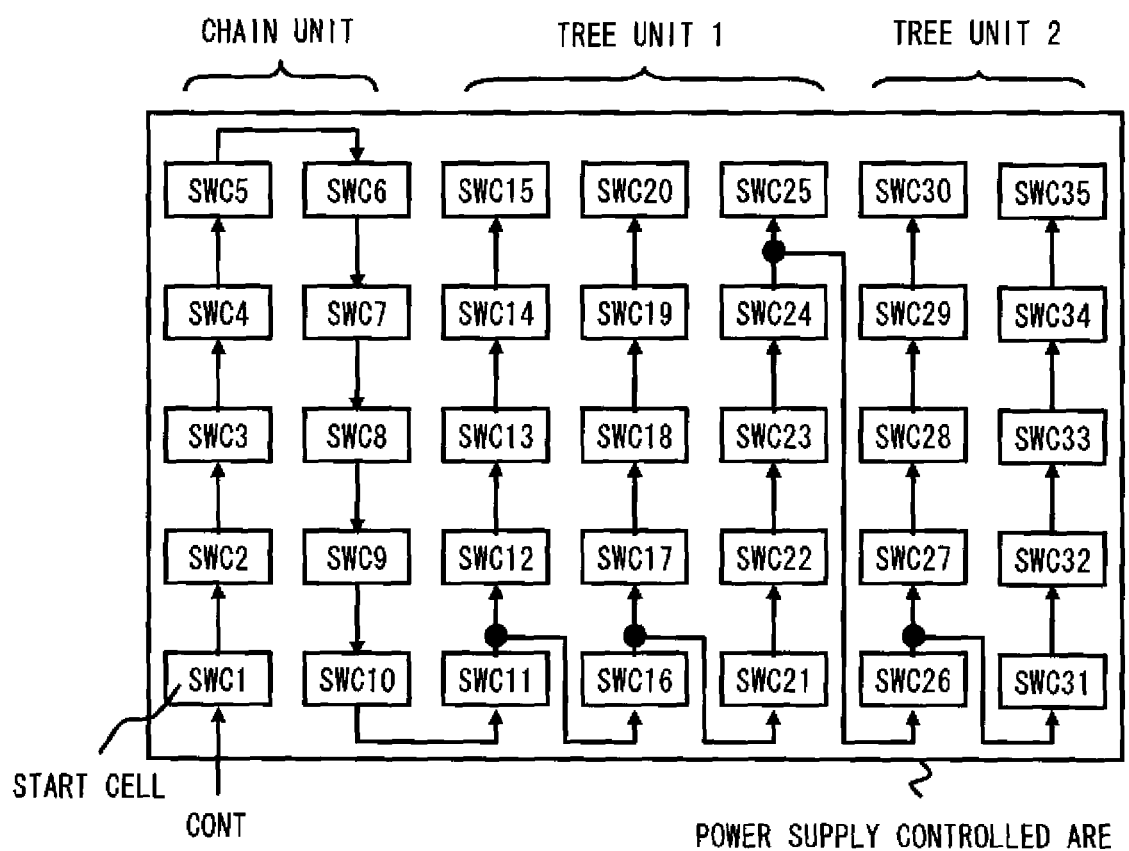
FIG. 12 is a schematic diagram illustrating a layout of switch transistors disposed in a power supply controlled area and a propagation order of a control signal propagated in the switch transistors according to a third exemplary embodiment.

FIG. 12 is a schematic diagram of the switch cell SWC disposed in the power supply controlled area of the semiconductor device according to the third exemplary embodiment. As illustrated in FIG. 12, in the third exemplary embodiment, a tree unit 2 is connected to the subsequent stage of the tree unit 1. In the tree unit 1, three switch transistors turn on in parallel. On the other hand, two switch transistors turn on in parallel in the tree unit 2.

Figure 13:
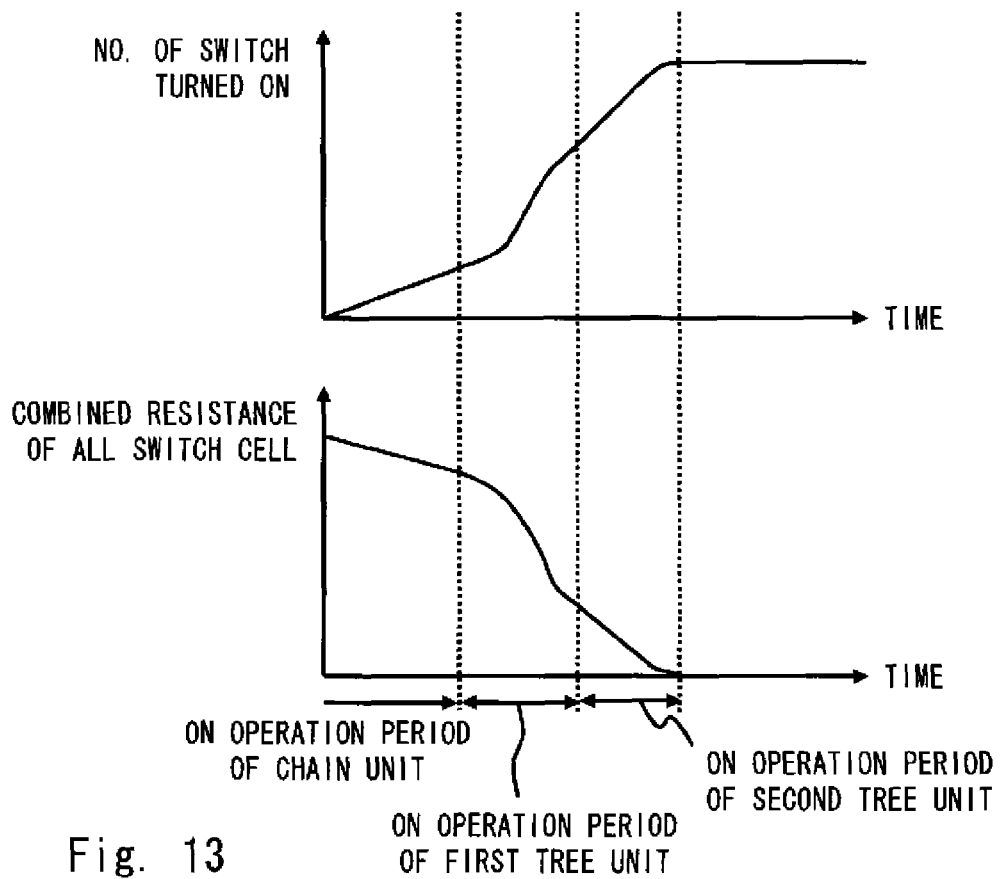
FIG. 13 is a graph depicting a time change of the number of the switch transistors that turn on and a time change of a combined resistance of all the switch transistors according to the third exemplary embodiment.
Figure 14:
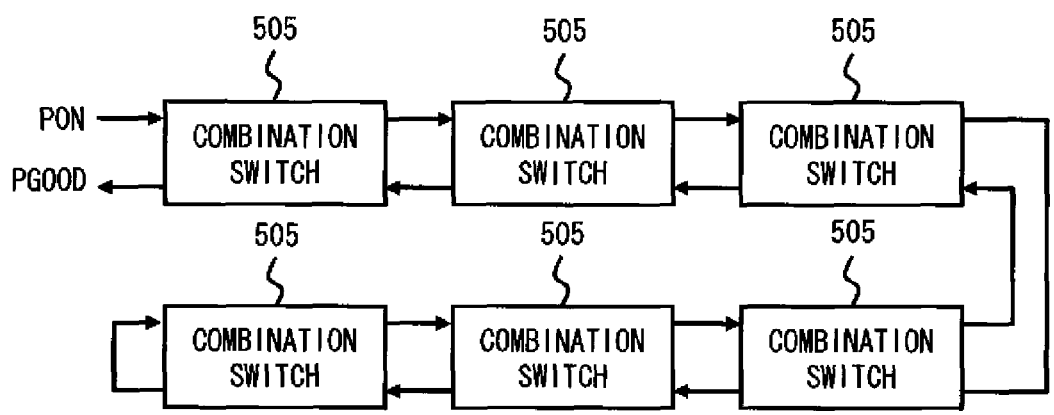
FIG. 14 is a block diagram of a power switching circuit disclosed in 2007/No. 0103202.
Figure 15:
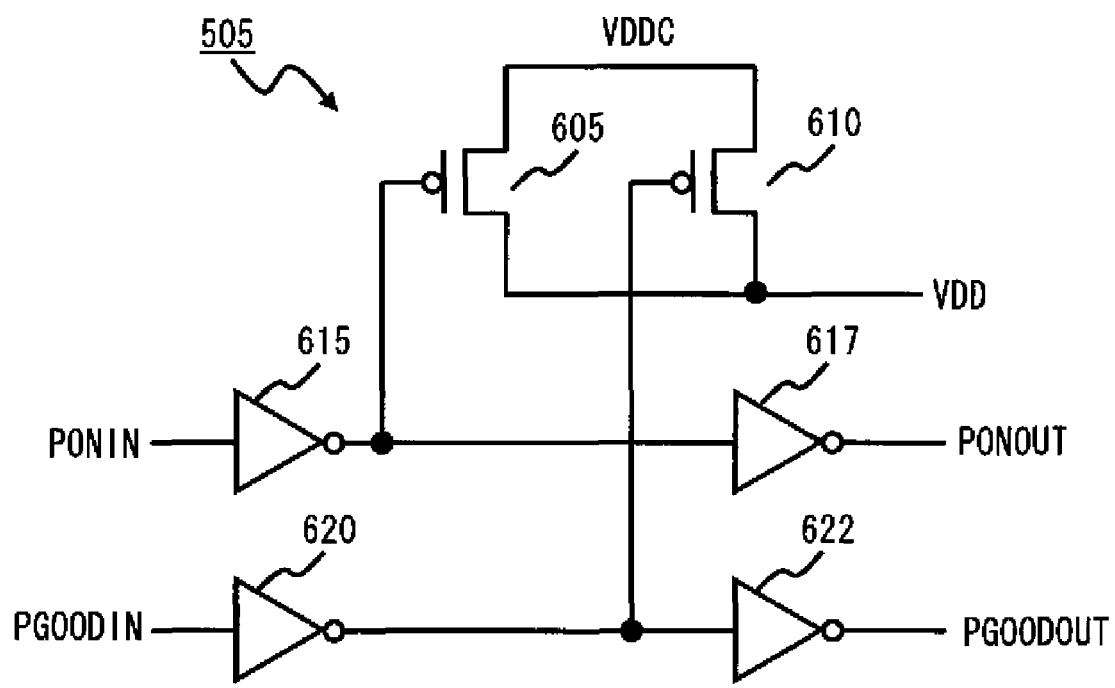
FIG. 15 is a circuit diagram of a combination switching circuit disclosed in United States Patent Publication No. 2007/0103202.
Figure 16:
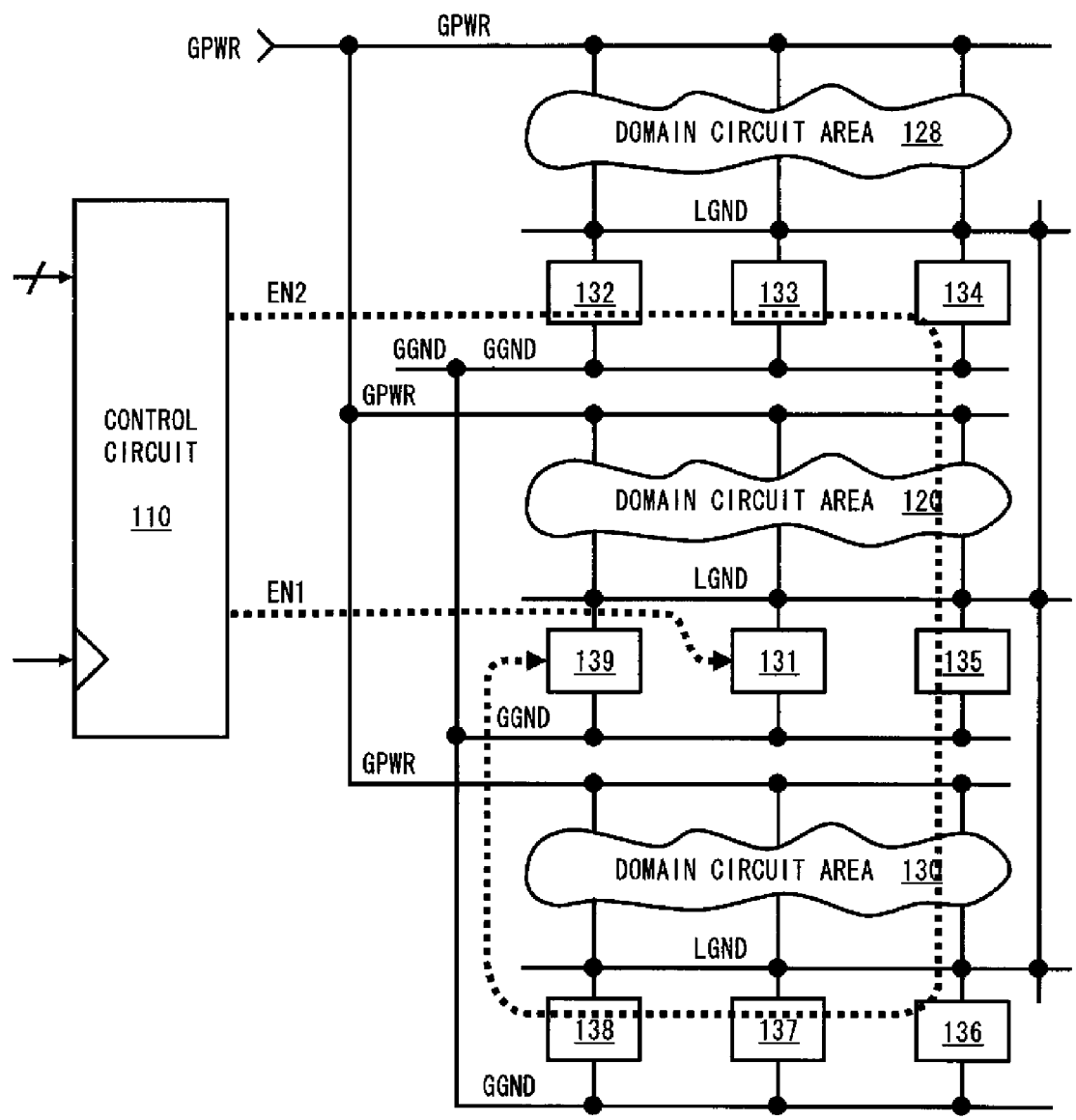
FIG. 16 is a block diagram of a distributed current supply switching circuit disclosed in Japanese Patent Translation Publication No. 2008-532265.

FIG. 13 is a graph depicting the time change of the number of the switch transistors SWTr that turned on in the semiconductor device of the third exemplary embodiment, and the time change of a combined resistance of all the switch transistors. The upper graph of FIG. 13 depicts the time change of the number of the switch transistors SWTr that turned on. As illustrated in the upper graph of FIG. 13, in the semiconductor device of the third exemplary embodiment, a first period (for example, the ON operation period of the chain unit) starts in response to an input of the control signal CONT. Then, in the ON operation period of the chain unit, the number of the switch transistors SWTr that turned on increases with time. Therefore, the increasing function of the number of the switch transistors SWTr that turned on in the ON operation period of the chain unit is a linear function. On the other hand, the second period (for example, the ON operation period of the tree unit 1) starts after completing the ON operation period of the chain unit. In the ON operation period of the tree unit 1, the number of the switch transistors SWTr that turned on increases one by one with time, and the gradient of this increase triples compared to that of the chain unit. Next, the third period (for example, the ON operation period of the tree unit 2) starts after completing the ON operation period of the tree unit. The number of the two switch transistors SWTr turn on in parallel in the ON operation period of the tree unit 2. Therefore, the gradient of the increase in the switch transistor that turn on doubles as compared to that of the chain unit.

Further, the lower graph of FIG. 13 indicates the time change of the combined resistance of all the switch transistors SWTr. As illustrated in the lower graph of FIG. 13, in the ON operation period of the chain unit, the combined resistance of all of the switch transistors SWTr is reduced according to the number of the switch transistors SWTr that turned on. At this time, the decreasing function of the combined resistance in the ON operation period of the chain unit is a linear function. On the other hand, as three switch transistors turn on in parallel in the ON operation period of the tree unit 1, the gradient of the decrease in the combined resistance triples as compared to that of the chain unit. On the other hand, as two switch transistors turn on in parallel in the ON operation period of the tree unit 2, the gradient of the decrease in the combined resistance doubles as compared to that of the chain unit.

In this way, by providing multiple stages in the tree unit, it is possible to change the gradient of the decrease in the combined resistance of all of switch transistors. As the decrease of the combined resistance of the switch transistors is multiple stages also in the third exemplary embodiment, it is possible to stabilize the potential of the global power supply line GVDD, reduce the time until all switch transistors turn on, and avoid a startup failure of the circuits disposed in the power supply controlled area.

The first to third exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A method of controlling a switch transistor in a semiconductor device, the semiconductor device comprising a plurality of switch transistors that control conducting states of a global power supply line and a local power supply line according to a control signal, the global power supply line supplying power to a plurality of circuit areas and the local power supply line supplying power to one of the plurality of circuit areas, the method comprising:

propagating the control signal in series in a first period and sequentially conducting the switch transistor, the first period starting in response to an assert of the control signal; and branching the control signal propagated in a second period following the first period and propagating the control signal in parallel and conducting the plurality of switch transistors in parallel by the control signal that is propagated in parallel, wherein in the second period, an increasing rate of the switch transistor to be conducted is larger than an increasing rate of the switch transistor to be conducted in the first period.

2. The method according to claim 1, wherein the switch transistor to be conducted increases based on a multidimensional function in the second period.

3. A method of controlling a switch transistor in a semiconductor device, the semiconductor device comprising a plurality of switch transistors that control conducting states of a global power supply line and a local power supply line according to a control signal, the global power supply line supplying power to a plurality of circuit areas and the local power supply line supplying power to one of the plurality of circuit areas, the method comprising:

propagating the control signal in series in a first period and sequentially conducting the switch transistor, the first period starting in response to an assert of the control signal; and branching the control signal propagated in a second period following the first period and propagating the control signal in parallel and conducting the plurality of switch transistors in parallel by the control signal that is propagated in parallel, wherein the switch transistor to be conducted increases based on a multidimensional function in the second period.

* * * * *